United States Patent
Yamamoto et al.

(10) Patent No.: US 8,069,816 B2
(45) Date of Patent: Dec. 6, 2011

(54) COATING FILM PROCESSING METHOD AND APPARATUS

(75) Inventors: Taro Yamamoto, Koshi (JP); Kousuke Yoshihara, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 1035 days.

(21) Appl. No.: 11/950,122

(22) Filed: Dec. 4, 2007

(65) Prior Publication Data

US 2008/0142043 A1 Jun. 19, 2008

(30) Foreign Application Priority Data

Dec. 18, 2006 (JP) ................. 2006-340186

(51) Int. Cl.
- *B05C 11/02* (2006.01)
- *B05C 11/00* (2006.01)
- *B05B 7/06* (2006.01)
- *G03D 5/00* (2006.01)

(52) U.S. Cl. .......... 118/697; 118/52; 118/612; 118/313; 118/600; 118/696; 396/611

(58) Field of Classification Search ............ 118/52, 118/612, 319, 320, 313–315, 695–698, 600; 396/604, 611, 627; 153/153, 198, 902; 427/240, 427/8, 9; 355/27, 30, 53

See application file for complete search history.

(56) References Cited

U.S. PATENT DOCUMENTS

| | | | |
|---|---|---|---|
| 2006/0231206 A1 | 10/2006 | Nagasaka et al. | |
| 2008/0057194 A1 * | 3/2008 | Tanaka | 427/240 |
| 2008/0088809 A1 * | 4/2008 | Kosugi et al. | 355/27 |

FOREIGN PATENT DOCUMENTS

| | | |
|---|---|---|
| JP | 11-333355 | 12/1999 |
| JP | 2001-319850 | 11/2001 |
| JP | 2003-324052 | 11/2003 |
| JP | 2004-117536 | 4/2004 |
| JP | 2006-80404 | 3/2006 |
| JP | 2006-235230 | 9/2006 |

OTHER PUBLICATIONS

Office Action issued Mar. 22, 2011, in Japan Patent Application No. 2006-340186 (with English translation).
Office Action issued Aug. 23, 2011 in Japanese Patent Application No. 2006-340186 filed Dec. 18, 2006 (with partial English translation)—7 pages.

\* cited by examiner

*Primary Examiner* — Yewebdar Tadesse
(74) *Attorney, Agent, or Firm* — Oblon, Spivak, McClelland, Maier & Neustadt, L.L.P.

(57) ABSTRACT

A coating film processing method is used for processing a coating film formed on a surface of a substrate to prepare for an immersion light exposure process arranged to perform light exposure through a liquid. The method includes supplying a solvent-containing liquid comprising a combination of a solvent and a solvent-ability decreasing agent for decreasing solvent ability, or a diluted solvent, onto an edge portion of the coating film, thereby performing edge portion cutting; and supplying a cleaning liquid onto the edge portion of the coating film, thereby performing edge portion cleaning, subsequently to the edge portion cutting.

11 Claims, 9 Drawing Sheets

COATING FILM PROCESSING METHOD AND APPARATUS

BACKGROUND OF THE INVENTION

1. Field of the Invention

The present invention relates to a coating film processing method and coating film processing apparatus for processing a coating film formed on the surface of a substrate, such as a semiconductor substrate, to prepare for an immersion light exposure process arranged to perform light exposure through a liquid.

2. Description of the Related Art

In the process of manufacturing semiconductor devices, photolithography techniques are used for forming circuit patterns on semiconductor wafers. Where a circuit pattern is formed by use of photolithography, the process steps are performed, as follows. Specifically, a resist liquid is first applied to a semiconductor wafer to form a resist film. Then, the resist film is irradiated with light to perform light exposure on the resist film in accordance with the circuit pattern. Then, the resist film is subjected to a developing process.

In recent years, the integration degree of semiconductor devices becomes increasingly higher to improve the operation speed and so forth. Accordingly, photolithography techniques are required to increase the miniaturization level of circuit patterns formed on semiconductor wafers. As a photolithography technique for realizing a high resolution of a 45-nm node level, there has been proposed the following immersion light exposure (for example, see U.S. Patent Application Publication No. US 2006/0231206 A1). In this immersion light exposure, a liquid, such as purified water, having a refractive index higher than air is supplied between the semiconductor wafer and light exposure projection lens. The wavelength of light radiated from the projection lens is shortened by means of the refractive index of the liquid, so that the line width obtained by the light exposure is decreased.

In the immersion light exposure, a resist film is sometimes covered with a liquid repellent protection film formed thereon to prevent the liquid from being impregnated into the resist film and to prevent resist components from being dissolved into the liquid. Further, for example, an anti-reflective coating is sometimes disposed below the resist film. In general, where a film, such as a resist film, is formed on the wafer surface, a coating liquid is first applied to form a coating film, and a solvent is then supplied onto the edge portion to perform an edge-cutting process. During this edge-cutting process, process defects, such as sags, disorders, and/or humps, can be easily generated. Where films are stacked one on the other on the wafer surface, as described above, process defects can be more easily generated at the edge portion.

If process defects are generated at the edge portion, when the liquid immersion head of an immersion light exposure apparatus is traveling across the wafer edge portion, stresses are applied to the edges (end faces) of films formed on the wafer, thereby causing film peeling. This film peeling may produce deposits on the wafer surface and generate development defects, and/or may contaminate the lens of the immersion light exposure apparatus.

In order to solve these problems, cleaning may be performed on the edge portion of a coating film to prevent film peeling, after the coating film formation and edge-cutting and before the immersion light exposure. In this case, however, the apparatus structure and process steps are complicated, because the edge-cutting is followed by a soft baking process, in general.

BRIEF SUMMARY OF THE INVENTION

An object of the present invention is to provide a coating film processing method and coating film processing apparatus, which can prevent a coating film from peeling off a substrate in immersion light exposure, without complicating the apparatus structure and process steps; and a computer readable storage medium that stores a control program for executing the coating film processing method.

According to a first aspect of the present invention, there is provided a coating film processing method for processing a coating film formed on a surface of a substrate to prepare for an immersion light exposure process arranged to perform light exposure through a liquid, the method comprising: supplying a solvent-containing liquid comprising a combination of a solvent and a solvent-ability decreasing agent for decreasing solvent ability, or a diluted solvent, onto an edge portion of the coating film, thereby performing edge portion cutting; and supplying a cleaning liquid onto the edge portion of the coating film, thereby performing edge portion cleaning, subsequently to the edge portion cutting.

In the first aspect of the present invention, the edge portion cutting may comprise mixing the solvent and the solvent-ability decreasing agent to prepare a mixture and supplying the mixture through one nozzle onto the edge portion of the coating film. The edge portion cutting may comprise supplying the solvent and the solvent-ability decreasing agent through respective nozzles onto the edge portion of the coating film. The method may further comprise supplying a cleaning liquid onto the edge portion of the coating film, thereby performing pre-cleaning on the edge portion, prior to the edge portion cutting. The cleaning liquid may be purified water.

The edge portion cleaning may be arranged to use as the cleaning liquid the solvent-ability decreasing agent used in the edge portion cutting. In this case, the edge portion cleaning may be arranged to supply the solvent-ability decreasing agent as the cleaning liquid through a nozzle used for supplying the solvent-ability decreasing agent in the edge portion cutting. The solvent-ability decreasing agent and the cleaning liquid may be purified water.

The edge portion cutting may comprise first supplying the solvent and the solvent-ability decreasing agent, and then supplying the diluted solvent, onto the edge portion of the coating film.

According to a second aspect of the present invention, there is provided a coating film processing apparatus for processing a coating film formed on a surface of a substrate to prepare for an immersion light exposure process arranged to perform light exposure through a liquid, the apparatus comprising: a spin chuck configured to hold and rotate the substrate in a horizontal state inside the process container; a rotary mechanism configured to rotate the spin chuck; a solvent-containing liquid supply mechanism configured to supply a solvent-containing liquid comprising a combination of a solvent and a solvent-ability decreasing agent for decreasing solvent ability, or a diluted solvent, onto an edge portion of the coating film formed on the surface of the substrate held by the spin chuck; and a cleaning liquid supply mechanism configured to supply a cleaning liquid onto the edge portion of the coating film formed on the surface of the substrate held by the spin chuck, wherein the apparatus is arranged to supply the solvent-containing liquid from the solvent-containing liquid supply mechanism onto the edge portion of the coating film, while holding and rotating the substrate by the spin chuck, thereby performing edge portion cutting; and then to supply the cleaning liquid from the cleaning liquid supply mechanism onto the edge portion of the coating film, thereby performing edge portion cleaning.

In the second aspect of the present invention, the cleaning liquid supply mechanism may be configured to supply purified water as the cleaning liquid. The cleaning liquid supply mechanism may include a cleaning liquid nozzle configured to supply the cleaning liquid.

The solvent-containing liquid supply mechanism may include a mixture supply nozzle configured to supply a mixture of the solvent and the solvent-ability decreasing agent. The solvent-containing liquid supply mechanism may include a solvent nozzle configured to supply the solvent and a solvent-ability decreasing agent nozzle configured to supply the solvent-ability decreasing agent. In this case, the cleaning liquid supply mechanism may be configured to use as the cleaning liquid the solvent-ability decreasing agent supplied from the solvent-containing liquid supply mechanism. The mixture supply nozzle or the solvent-ability decreasing agent nozzle may serve as a cleaning liquid nozzle for supplying the cleaning liquid of the cleaning liquid supply mechanism. Further in this case, the solvent-ability decreasing agent and cleaning liquid may be purified water.

The solvent-containing liquid supply mechanism may include a diluted solvent nozzle configured to supply the diluted solvent. The apparatus may further comprise a coating liquid supply mechanism and may be arranged to supply the coating liquid from coating liquid supply mechanism onto the substrate, while rotating the substrate, thereby forming the coating film, and then to supply the solvent-containing liquid from the solvent-containing liquid supply mechanism onto the edge portion of the coating film.

According to a third aspect of the present invention, there is provided a computer readable storage medium that stores a control program for execution on a computer, the control program, when executed, causing the computer to control a coating film processing apparatus to conduct the method according to the first aspect of the present invention.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An embodiment of the present invention will now be described with reference to the accompanying drawings.

Figure 1:
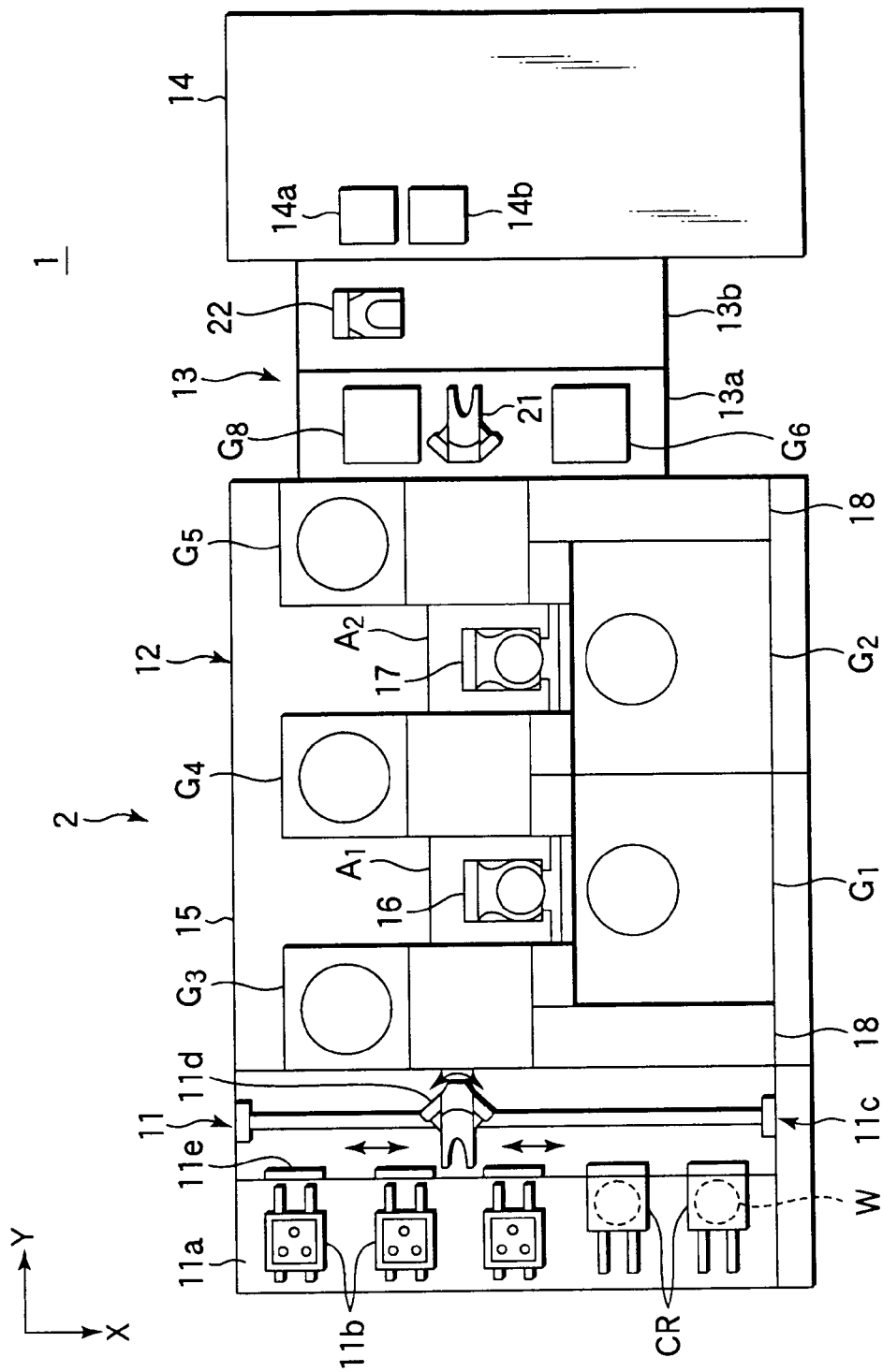
FIG. 1 is a plan view schematically showing a pattern forming system including a top coating unit, which is an example of a coating film processing apparatus usable for performing a coating film processing method according to an embodiment of the present invention.
Figure 2:
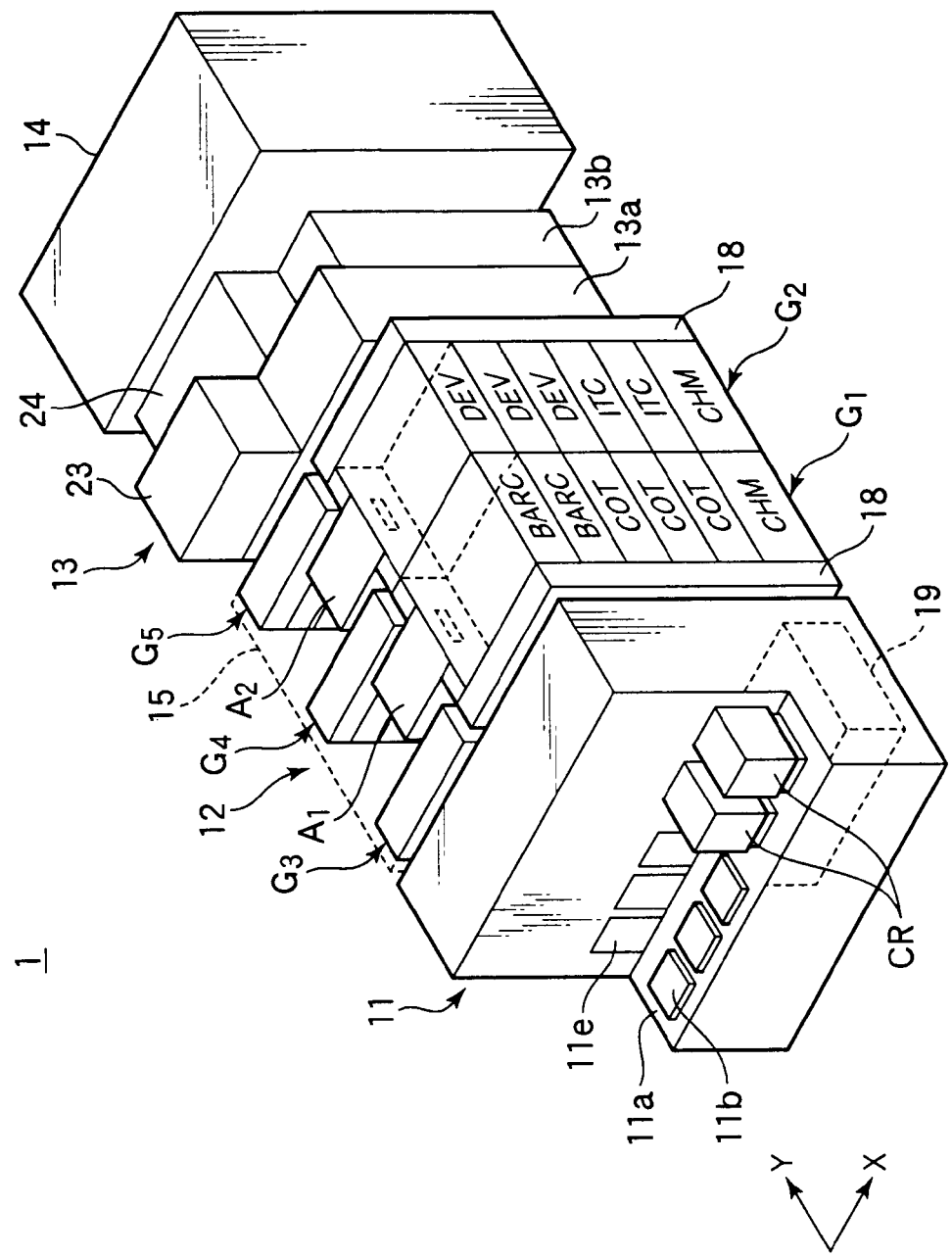
FIG. 2 is a perspective view schematically showing the pattern forming system shown in FIG. 1.

FIG. 1 is a plan view schematically showing a pattern forming system including a top coating unit, which is an example of a coating film processing apparatus usable for performing a coating film processing method according to an embodiment of the present invention. FIG. 2 is a perspective view schematically showing the pattern forming system shown in FIG. 1.

The pattern forming system 1 is designed to form a predetermined resist pattern on a semiconductor substrate or wafer W. The system includes a coating/developing apparatus 2 for applying a resist liquid onto the wafer W to form a resist film and for performing development after light exposure, and an immersion light exposure apparatus 14 for performing a light exposure process on the wafer W. The coating/developing apparatus 2 includes a cassette station 11 used as a transfer station for wafers W, a process station 12 comprising a plurality of processing units each for performing a predetermined process on a wafer W, and an interface station 13 for transferring wafers W between the process station 12 and light exposure apparatus 14. The cassette station 11, process station 12, interface station 13, and light exposure apparatus 14 are arrayed in series in this order in the longitudinal direction of the pattern forming system 1 (Y-direction).

The cassette station 11 includes a cassette table 11a for placing thereon wafer cassettes (CR) each storing a plurality of, such as 13, wafers W, and a wafer transfer mechanism 11c for transferring wafers W between the wafer cassettes (CR) placed on the cassette table 11a and a transit unit located in a third processing unit group $G_3$ in the process station 12 described later. The cassette table 11a has a plurality of, such as 5, positioning portions 11b each for positioning a wafer cassette (CR), arrayed thereon in the width direction of the pattern forming system 1 (X-direction). A wafer cassette (CR) is placed at each of the positioning portions 20a such that its transfer port faces an opening/closing portion 11e formed in a wall of the casing of the wafer transfer mechanism 11c. The wafer transfer mechanism 11c includes a transfer pick 11d disposed in the casing for handling wafers W, so that the wafers W are transferred by the transfer pick 11d between the wafer cassettes (CR) on the cassette table 11a and the transit unit.

The process station 12 is arranged in a casing 15, on the front side of which (lower side in FIG. 1), the process station 12 includes a first processing unit group $G_1$ and a second processing unit group $G_2$ arrayed in this order from the cassette station 11 toward the interface station 13. On the rear side of the casing 15 (upper side in FIG. 1), the process station 12 includes a third processing unit group $G_3$, a fourth processing unit group $G_4$, and a fifth processing unit group $G_5$ arrayed in this order from the cassette station 11 toward the interface station 13. Further, the process station 12 includes a first main transfer section $A_1$ interposed between the third processing unit group $G_3$ and fourth processing unit group $G_4$, and a second main transfer section $A_2$ interposed between the fourth processing unit group $G_4$ and fifth processing unit group $G_5$.

The first processing unit group $G_1$ includes a plurality of processing units stacked one on the other, which are formed of, e.g., two bottom coating units (BARC) for forming an anti-reflective coating that prevents reflection of light during light exposure on a wafer W, and three resist coating units (COT) for performing resist coating on the surface of a wafer W to form a resist film. The second processing unit group $G_2$ includes a plurality of processing units stacked one on the other, which are formed of, e.g., three development units (DEV) for developing a resist film formed on a wafer W after light exposure, and two top coating units (ITC) for supplying a protection film coating liquid onto the surface of a resist film formed on a wafer W to form a protection film, which is used as a liquid repellent film repellent to an immersion light exposure liquid described later. The top coating units (ITC) will be explained later in detail.

Each of the third processing unit group $G_3$, fourth processing unit group $G_4$, and fifth processing unit group $G_5$ includes a plurality of processing units stacked one on the other, which are formed of, e.g., an adhesion unit for performing a hydrophobic process on a wafer W, a pre-baking unit for performing a heating process on a wafer W after resist coating, a post-baking unit for performing a heating process on a wafer W after development, a post-exposure baking unit for performing a heating process on a wafer W after light exposure and before development, and so forth. The third processing unit group $G_3$ includes a transit unit through which wafers W are transferred between the cassette station 11 and first main transfer section Al. The fifth processing unit group $G_5$ includes a transit unit through which wafers W are transferred between the second main transfer section $A_2$ and a first wafer transfer mechanism 21 used in the interface station 13 described later.

The first main transfer section $A_1$ is provided with a first main wafer transfer arm 16 for handling wafers W, which can selectively access the units located in the first processing unit group $G_1$, third processing unit group $G_3$, and fourth processing unit group $G_4$. The second main transfer section $A_2$ is provided with a second main wafer transfer arm 17 for handling wafers W, which can selectively access the units located in the second processing unit group $G_2$, fourth processing unit group $G_4$, and fifth processing unit group $G_5$.

Temperature/humidity adjusting units 18 are respectively disposed between the first processing unit group $G_1$ and cassette station 11 and between the second processing unit group $G_2$ and interface station 13. Each of the temperature/humidity adjusting units 18 includes a temperature adjusting device for process liquids to be supplied to the first and second processing unit groups $G_1$ and $G_2$, and a duct for adjustment of temperature and humidity. Chemical unit (CHM) are respectively disposed below the first and second processing unit groups $G_1$ and $G_2$, for supplying chemical solutions to the first and second processing unit groups $G_1$ and $G_2$.

Figure 3:
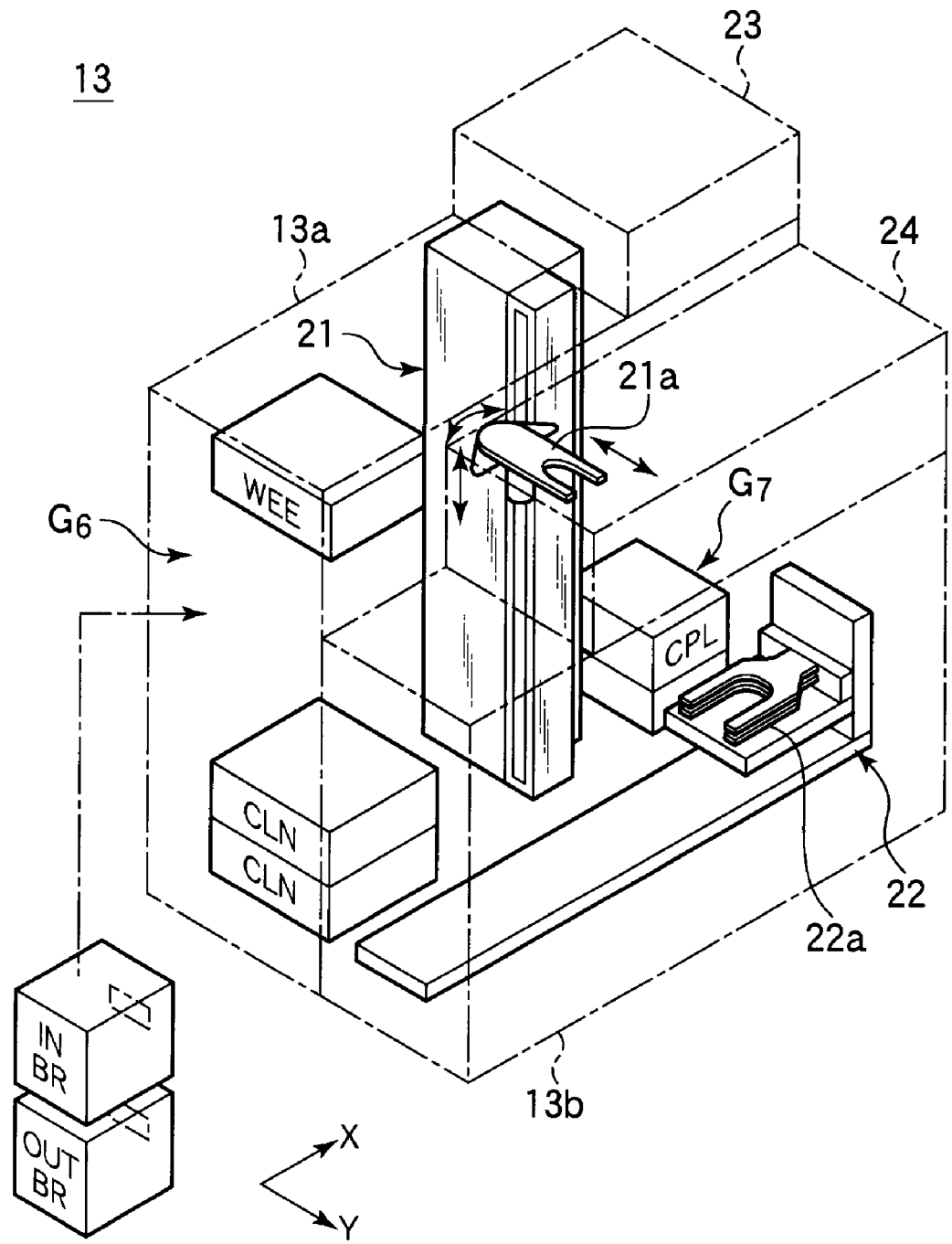
FIG. 3 is a perspective view schematically showing an interface station used in the pattern forming system shown in FIG. 1.

As shown in the schematic perspective view of FIG. 3, the interface station 13 has a casing that defines a first interface station 13a on the process station 12 side and a second interface station 13b on the light exposure apparatus 14 side. The first interface station 13a is provided with a first wafer transfer mechanism 21 disposed to face an opening portion of the fifth processing unit group $G_5$ for transferring wafers W. The second interface station 13b is provided with a second wafer transfer mechanism 22 movable in the X-direction for transferring wafers W.

A sixth processing unit group $G_6$ is located on the front side of the first interface station 13a, and includes a plurality of processing units stacked one on the other, which are formed of a periphery light exposure unit (WEE), an incoming buffer cassette (INBR), an outgoing buffer cassette (OUTBR), and two cleaning units (CLN). The periphery light exposure unit (WEE) is used for performing light exposure selectively only on the edge portion of a wafer W to remove an unnecessary resist portion near the edge of the wafer. The incoming buffer cassette (INBR) is used for temporarily placing wafers W to be transferred to the light exposure apparatus 14. The outgoing buffer cassette (OUTBR) is used for temporarily placing wafers W transferred from the light exposure apparatus 14. The cleaning units (PRECLN) are used for cleaning a wafer before and after transfer to and from the light exposure apparatus 14. A seventh processing unit group $G_7$ is located on the rear side of the first interface station 13a, and includes, e.g., two high-precision temperature adjusting units (CPL), stacked one on the other, for adjusting the temperature of a wafer W with high precision.

The first wafer transfer mechanism 21 includes a fork 21a for transferring wafers W. The fork 21a can selectively access the units located in the fifth processing unit group $G_5$, sixth processing unit group $G_6$, and seventh processing unit group $G_7$ to transfer wafers W between these units.

The second wafer transfer mechanism 22 includes a fork 22a for transferring wafers W. The fork 22a can selectively access the cleaning units (CLN) of the sixth processing unit group $G_6$, the units located in the seventh processing unit group $G_7$, and an incoming stage 14a and an outgoing stage 14b of the light exposure apparatus 14 described later to transfer wafers W between these portions.

A gas flow adjusting section 23 is disposed on top of the first interface station 13a to adjust the gas flow inside the first interface station 13a or interface station 13. A humidifier section 24 is disposed on top of the second interface station 13b to humidify the atmosphere inside the second interface station 13b or interface station 13 not to dry a wafer W transferred from the light exposure apparatus.

The light exposure apparatus 14 is arranged to perform a so-called immersion light exposure process for subjecting a resist film formed on a wafer W to light exposure in accordance with a predetermined pattern, while immersing the resist film in a liquid, such as purified water. The light exposure apparatus 14 includes an incoming stage 14a for placing thereon wafers W transferred from the interface station 13, before the light exposure process, and an outgoing stage 14b for placing thereon wafers W to be transferred to the interface station 13, after the light exposure process.

Figure 4:
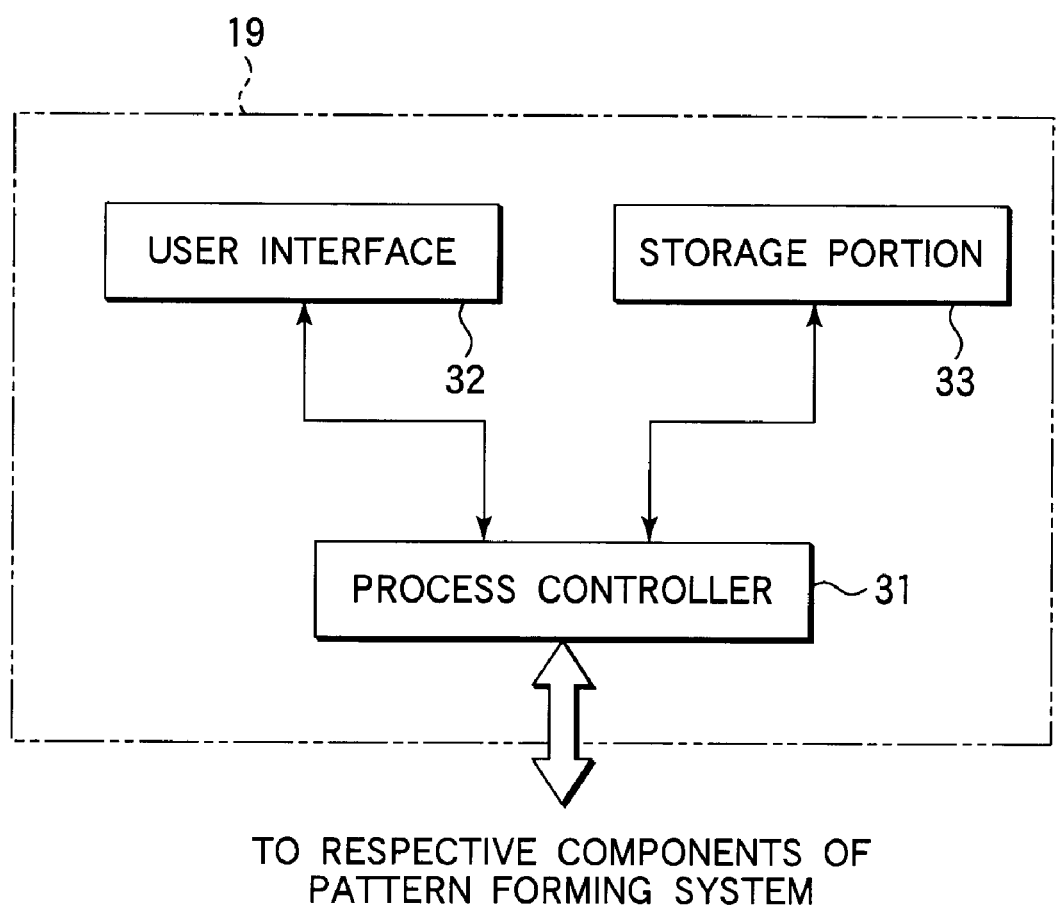
FIG. 4 is a block diagram showing a control section used in the pattern forming system shown in FIG. 1.

As shown in FIG. 2, a control section 19 is located below the cassette station 11 and is used for controlling this pattern forming system 1, as a whole. As shown in the block diagram of FIG. 4, this control section 19 includes a process controller 31 comprising a micro processor (MPU) for controlling the respective components, such as processing units and transfer mechanisms, of the pattern forming system 1. The control section 19 further includes a user interface 32, which includes, e.g., a keyboard and a display, wherein the keyboard is used for an operator to input commands for operating the respective components of the pattern forming system 1, and the display is used for showing visualized images of the operational status of the respective components of the pattern forming system 1. The control section 19 further includes a storage portion 33, which stores data for performing processes.

The storage portion 33 stores various control programs for realizing various processes performed in the pattern forming system 1 under the control of the process controller 31. The storage portion 33 also stores a plurality of recipes with process condition data and process sequences recorded therein, and databases necessary for performing processes.

When a process is performed, a required recipe is retrieved from the storage portion 33 and executed by the process controller 31 in accordance with an instruction or the like input through the user interface 32. Consequently, each of various predetermined processes is performed in the pattern forming system 1 under the control of the process controller 31. Recipes may be stored in a computer readable storage medium, such as a CD-ROM, hard disk, flexible disk, or nonvolatile memory. Further, recipes may be utilized on-line, while it is transmitted from a suitable apparatus through, e.g., a dedicated line, as needed.

Next, process steps performed in the pattern forming system 1 will be explained.

In the pattern forming system 1 arranged as described above, wafers W are taken out one by one from a wafer cassette (CR) by the transfer pick 11d. A wafer W thus taken out is transferred by the transfer pick 11d into the transit unit of the third processing unit group $G_3$ of the process station 12. Then, the wafer W is sequentially transferred by the first and second main transfer sections $A_1$ and $A_2$ through predetermined units in the first to fifth processing unit groups $G_1$ to $G_5$, so that the wafer W is subjected to a series of processes in accordance with the order prescribed in the recipe.

For example, the wafer W is subjected to formation of an anti-reflective coating in one of the bottom coating units (BARC), formation of a resist film in one of the resist coating units (COT), formation of a protection film in one of the top coating units (ITC), and a pre-baking process in the pre-baking unit in this order. In each top coating unit (ITC), formation of a protection film is following by edge portion cutting and edge portion cleaning performed therein. The process performed in the top coating unit (ITC) will be explained later in detail.

In place of the formation of an anti-reflective coating in one of the bottom coating units (BARC), the wafer W may be subjected to an adhesion process in the adhesion unit. Further, the wafer W may be subjected to formation of an anti-reflective coating on a resist film and formation of a protection film on the anti-reflective coating.

After the wafer W is subjected to a series of processes in the process station 12, the wafer W is transferred into the transit unit of the fifth processing unit group $G_5$. Then, the wafer W is transferred by the first wafer transfer mechanism 21 into one of the cleaning units (CLN), in which the wafer W is subjected to cleaning. As needed, it may be arranged such that, before the wafer W is transferred into one of the cleaning units (CLN), the wafer W is transferred into the periphery light exposure unit (WEE), in which the wafer W is subjected to periphery light exposure, and is then transferred to the incoming buffer cassette (INBR). If the edge cleaning process performed in one of the top coating units (ITC) provides sufficient cleaning, the cleaning by one of the cleaning units (CLN) is not necessarily required.

Then, the wafer W is transferred by the second wafer transfer mechanism 22 into one of the high-precision temperature adjusting units (CPL), in which the wafer W is adjusted to a predetermined temperature. Then, the wafer W is transferred by the second wafer transfer mechanism 22 to the incoming stage 14a of the light exposure apparatus 14. Then, the wafer W is subjected to an immersion light exposure process in the light exposure apparatus 14. When the immersion light exposure process is performed in the light exposure apparatus 14, a liquid, such as purified water, is supplied between the wafer W and light exposure projection lens. Then, while the wafer W is moved, a mask pattern image is projected onto the resist film through the liquid from the projection lens at a predetermined magnification for light exposure. After the immersion light exposure process is finished, the wafer W is transferred to the outgoing stage 14b. Then, the wafer W is transferred by the second wafer transfer mechanism 22 into one of the cleaning units (CLN), in which the wafer W is subjected to cleaning.

After the cleaning in one of the cleaning units (CLN) is finished, the wafer W is transferred by the first wafer transfer mechanism 21 into the transit unit of the fifth processing unit group $G_5$. Then, the wafer W is sequentially transferred by the first and second main transfer sections $A_1$ and $A_2$ through predetermined units in the first to fifth processing unit groups $G_1$ to $G_5$, so that the wafer W is subjected to a series of processes in accordance with the order prescribed in the recipe. For example, the wafer W is subjected to a post-exposure baking process in the post-exposure baking unit, a development process in one of the development units (DEV), and a post-baking process in the post-baking unit in this order. Then, the wafer W is transferred into the transit unit of the third processing unit group $G_3$, and is further transferred to a wafer cassette (CR) placed on the cassette station 11.

Next, a detailed explanation will be given of the top coating unit (ITC).

Figure 5:
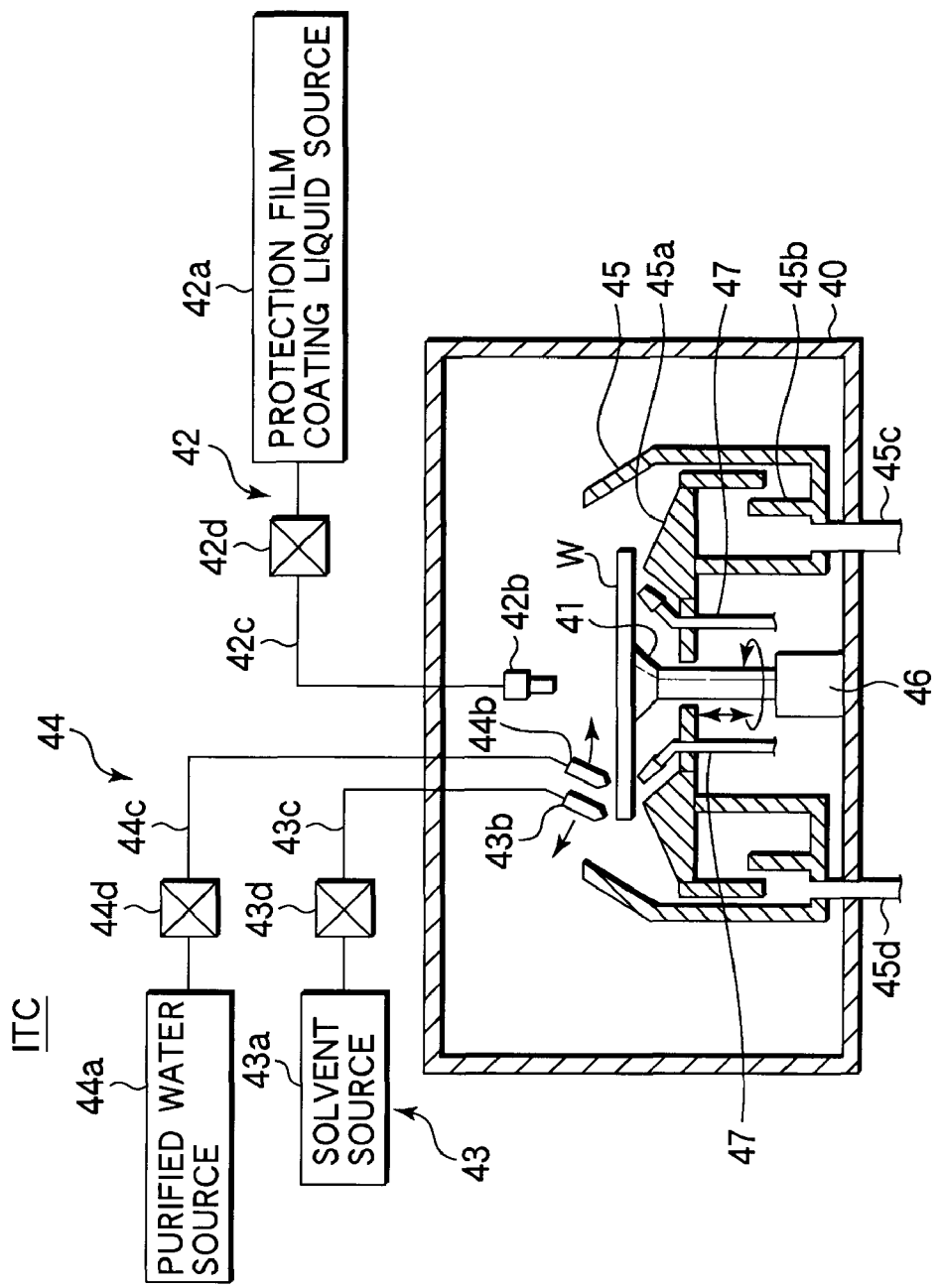
FIG. 5 is a sectional side view schematically showing the structure of the top coating unit disposed in the pattern forming system shown in FIG. 1.
Figure 6:
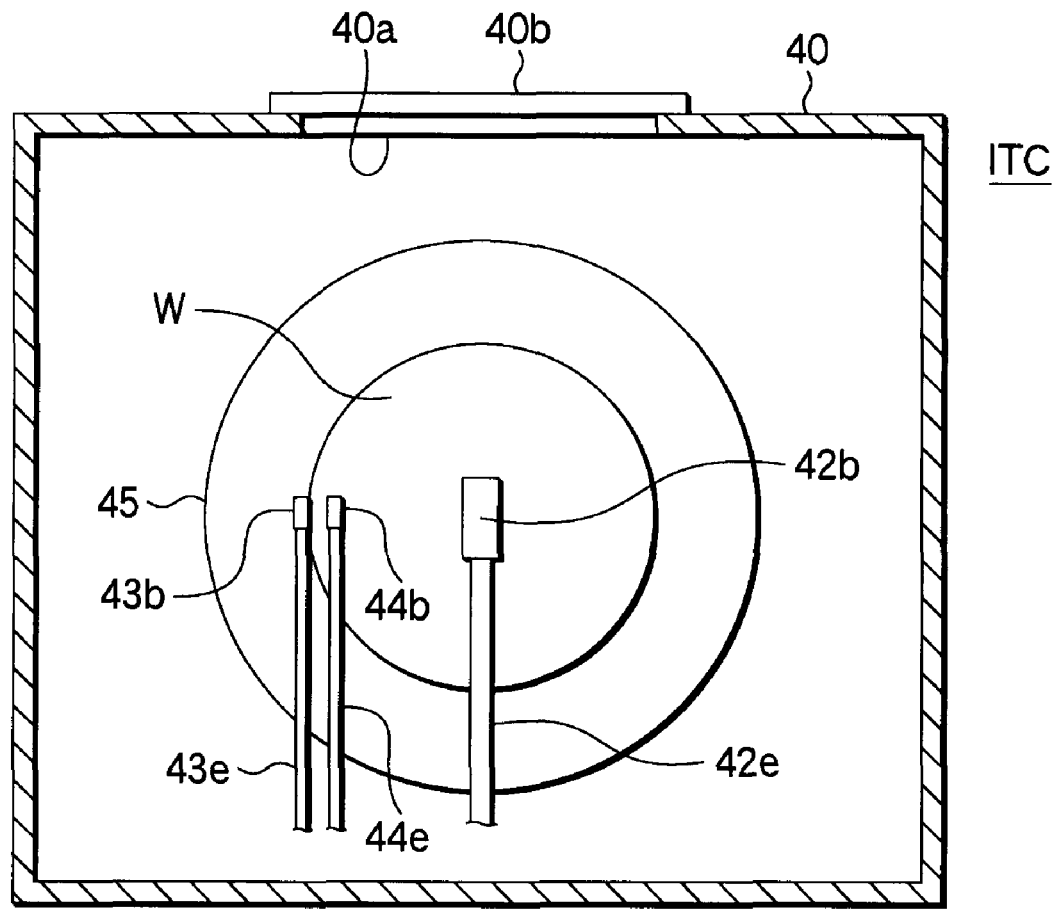
FIG. 6 is a sectional plan view schematically showing the structure of the top coating unit disposed in the pattern forming system shown in FIG. 1.

FIG. 5 is a sectional side view schematically showing the structure of each top coating unit (ITC) disposed in the pattern forming system. FIG. 6 is a sectional plan view schematically showing the structure of the top coating unit (ITC).

The top coating unit (ITC) includes a chamber 40 for accommodating a wafer W, and a spin chuck 41 located inside the chamber 40 to hold and rotate the wafer W in a horizontal state. A protection film coating liquid supply mechanism 42 is disposed to supply a protection film coating liquid onto the front surface (upper side) of the wafer W held by the spin chuck 41. A solvent supply mechanism 43 is disposed to supply a solvent (removing liquid or peeling liquid) for removing part of the protection film onto the peripheral portion (edge portion) of the wafer W held by the spin chuck 41. A purified water supply mechanism 44 is disposed to supply purified water (cleaning liquid) onto the peripheral portion of the wafer W held by the spin chuck 41. A cup body 45 is disposed to receive the protection film coating liquid, solvent, and purified water flowing down or thrown off from the wafer W held by the spin chuck 41. The spin chuck 41 can be rotated and moved up and down by a driving mechanism 46 including a motor and so forth.

The chamber 40 has a transfer port 40a formed in, e.g., a sidewall thereof facing the second main transfer section $A_2$ (see FIG. 1) for transferring the wafer W into and from the chamber 40 by the second wafer transfer mechanism 22. The transfer port 40a is provided with a shutter 40b for opening/closing the port. The spin chuck 41 is configured to hold the wafer W by, e.g., a vacuum attraction force.

The protection film coating liquid supply mechanism 42 includes a protection film coating liquid source 42a for supplying a protection film coating liquid that is soluble in a predetermined solvent, such as a fluoro-chemical solvent, and a protection film coating liquid nozzle 42b for supplying the protection film coating liquid from the protection film coating liquid source 42a onto the wafer W held by the spin chuck 41. The protection film coating liquid source 42a is connected to the protection film coating liquid nozzle 42b through a conduit line 42c for supplying the protection film coating liquid. The conduit line 42c is provided with a valve 42d for adjusting the flow rate of the protection film coating liquid flowing therethrough. The protection film coating liquid nozzle 42b is supported by the nozzle arm 42e, which has a base portion slidably connected to a guide rail (not shown) extending in the Y-direction inside the chamber 40. Further, the protection film coating liquid nozzle 42b is movable up and down.

The solvent supply mechanism 43 includes a solvent source 43a for supplying a predetermined solvent, such as a thinner, and a solvent nozzle 43b for delivering the solvent from the solvent source 43a onto the upper peripheral portion of the wafer W held by the spin chuck 41. The solvent source 43a is connected to the solvent nozzle 43b through a conduit line 43c for supplying the solvent. The conduit line 43c is provided with a valve 43d for adjusting the flow rate of the solvent flowing therethrough. The solvent nozzle 43b is supported by the nozzle arm 43e, which is slidably connected to a guide rail (not shown) extending in the Y-direction. Further, the solvent nozzle 43b is movable up and down. Furthermore, the solvent nozzle 43b is adjustable in the angle relative to the surface of the wafer W.

The purified water supply mechanism 44 includes a purified water source 44a for supplying purified water that serves as a solvent-ability decreasing agent and a cleaning liquid, and a purified water nozzle 44b for delivering purified water from the purified water source 44a onto the upper peripheral portion of the wafer W held by the spin chuck 41. The purified water source 44a is connected to the purified water nozzle 44b through a conduit line 44c for supplying the purified water. The conduit line 44c is provided with a valve 44d for adjusting the flow rate of purified water flowing therethrough. The purified water nozzle 44b is supported by the nozzle arm 44e, which is slidably connected to a guide rail (not shown) extending in the Y-direction. Further, the purified water nozzle 44b is movable up and down. Furthermore, the purified water nozzle 44b is adjustable in the angle relative to the surface of the wafer W.

On the back side of the wafer W, two back surface cleaning nozzles 47 are disposed, so that cleaning can be performed on the back surface of the wafer.

The cup body 45 has an opening at the top and is configured to surround the wafer W held by the spin chuck 41 when the spin chuck 41 holding the wafer W is moved down. Further, the upper end side of the cup body 45 is inclined upward and inward to reliably receive the protection film coating liquid, solvent, and purified water thrown off from the wafer W. The cup body 45 is provided with a partition wall 45b disposed therein on the bottom wall at a middle position in the radial direction to divide the bottom wall into the outer side and inner side. The outer side of the bottom wall of the cup body 45 divided by the partition wall 45b is connected to a drain line 45d extending through the bottom of the chamber 40 for discharging the protection film coating liquid, solvent, and purified water received by the cup body 45. The inner side of the bottom wall of the cup body 45 divided by the partition wall 45b is connected to a gas exhaust line 45c extending through the bottom of the chamber 40. The cup body 45 is further provided with a guide ring 45a disposed therein at a position above the partition wall 45b and blow the wafer W held by the spin chuck 41, for guiding the protection film coating liquid, solvent, and purified water. The guide ring 45a is inclined outward and downward, so that it guides the protection film coating liquid, solvent, and purified water to a position outside the partition wall 45b of the cup body 45.

Figure 7:
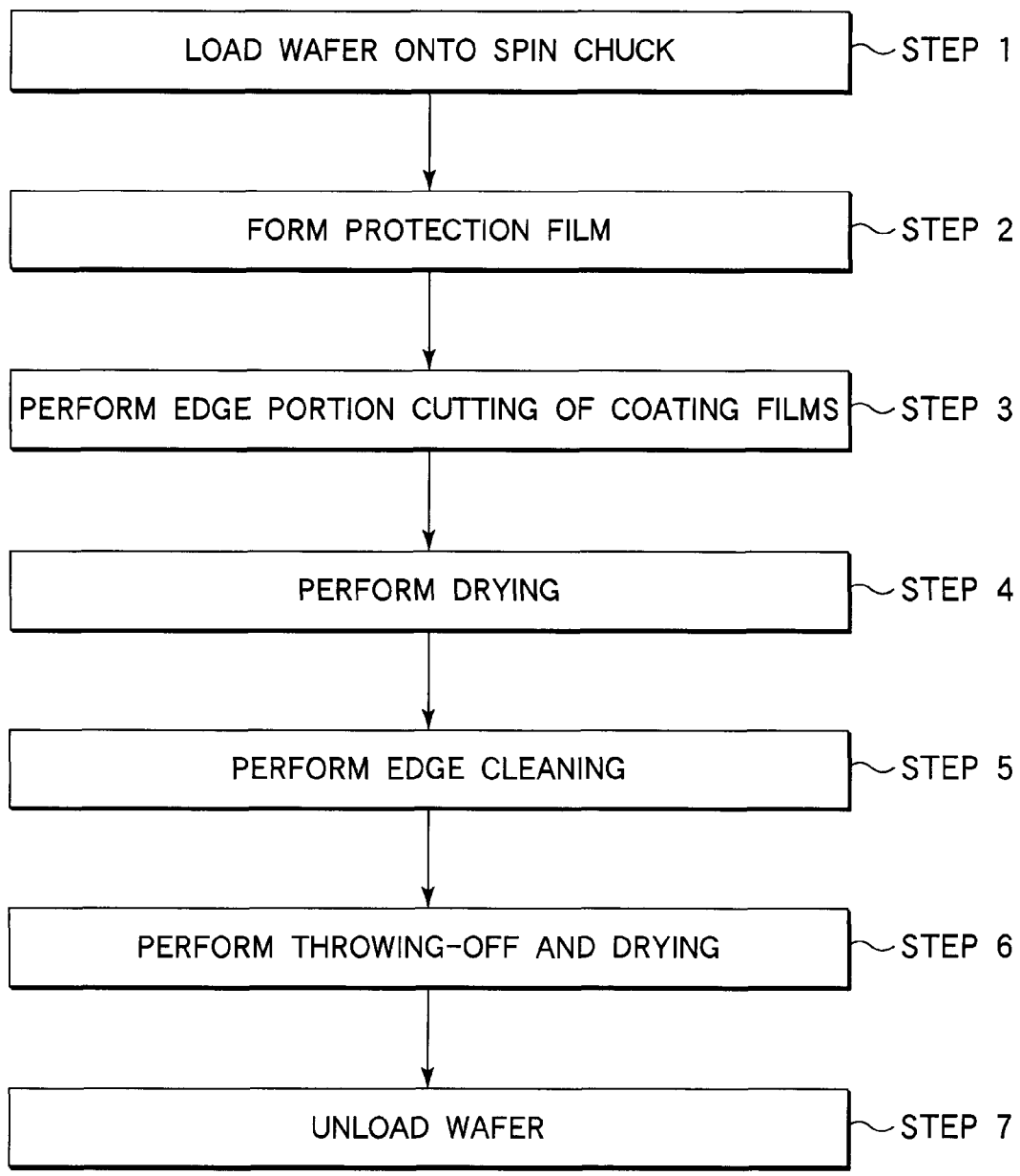
FIG. 7 is a flow chart showing a process operation performed in the top coating unit disposed in the pattern forming system shown in FIG. 1.

Next, an explanation will be given of an operation performed in the top coating unit (ITC) thus structured, with reference to FIG. 7.

At first, a wafer W is loaded through the transfer port 40a into the chamber 40. The spin chuck 41 is moved up, so that the wafer W is held on the spin chuck 41 by a vacuum attraction force. Then, the transfer port 40a is closed by the shutter 40b, and the spin chuck 41 is moved down, so that the wafer W is surrounded by the cup body 45 (STEP 1). Then, the protection film coating liquid is supplied from the protection film coating liquid nozzle 42b of the protection film coating liquid supply mechanism 42 onto the center of the wafer W. At this time, the wafer W is rotated by the spin chuck 41, so that the protection film coating liquid is spread toward the peripheral portion of the wafer W and is applied all over the wafer W. Consequently, a protection film is formed on the surface of the resist film on the wafer W (STEP 2).

After the protection film is formed, while the wafer W is rotated by the spin chuck 41, the solvent is supplied from the solvent nozzle 43b of the solvent supply mechanism 43, and purified water is supplied as a solvent-ability decreasing agent from the purified water nozzle 44b of the purified water supply mechanism 44, both onto the peripheral portion of the wafer W. Consequently, edge portion cutting is performed by dissolving that part of the coating films including the protection film, which is present at the edge portion of the wafer W (STEP 3). At this time, a thinner or the like is supplied from the back surface cleaning nozzles 47 to perform cleaning on the back surface of the wafer W. This back surface cleaning may be performed in parallel with the supply of the protection film coating liquid, prior to the supply from the solvent nozzle 43b.

Figure 8:
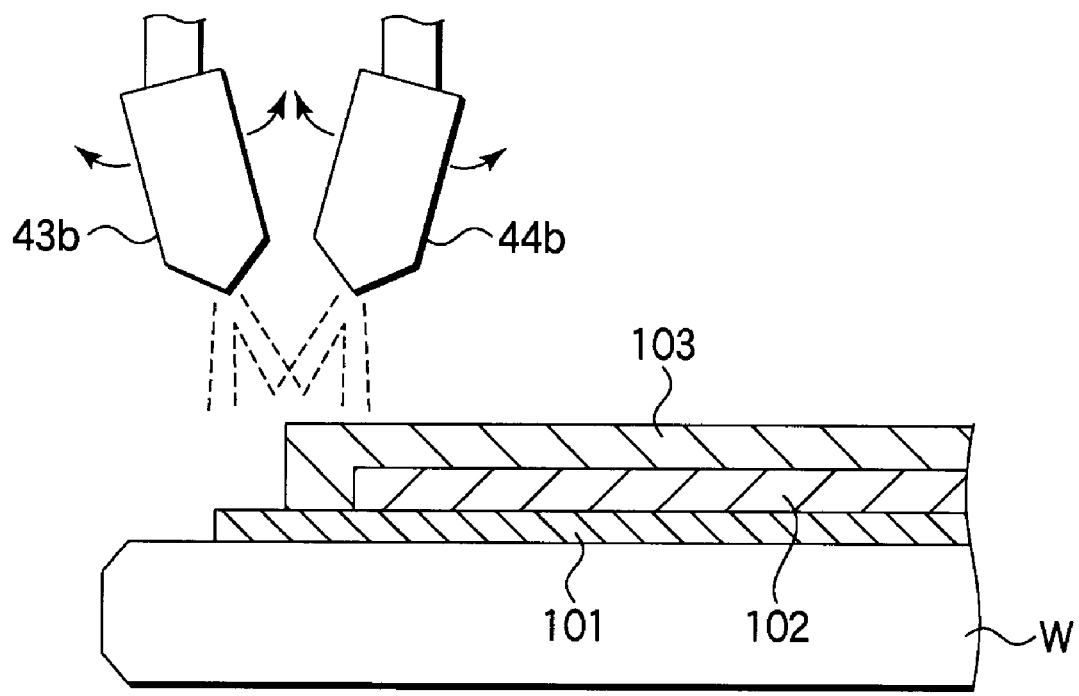
FIG. 8 is a view for explaining the state of nozzles in performing edge portion cutting in the top coating unit disposed in the pattern forming system shown in FIG. 1.

As described above, purified water used as a solvent-ability decreasing agent is supplied along with the solvent, so that the solvent ability on the edge portion is decreased. In this case, even where no soft baking process is performed, the edge portion is prevented from suffering process defects, such as sags, disorders, and/or humps. According to this embodiment, as shown in FIG. 8, when the solvent and purified water are supplied onto the peripheral portion of coating films including a protection film 103, the solvent nozzle 43b and purified water nozzle 44b are adjusted and set in suitable angles, so that the solvent and purified water are supplied onto the appropriate position with few splashes on a wafer W. As shown in FIG. 8, before the protection film 103 is formed, a reflective coating 101 and a resist film 102 are formed on the surface of the wafer W in this order.

Thereafter, the supply of the solvent from the solvent supply mechanism 43 and the supply of purified water from the purified water supply mechanism 44 are stopped, and the wafer W is rotated at a high speed to perform a drying process (STEP 4). In this case, since the solvent ability has been decreased by purified water, it is not necessarily required to completely dry the solvent.

Then, purified water is supplied as a cleaning liquid from the purified water nozzle 44b of the purified water supply mechanism 44, thereby performing edge cleaning (STEP 5). Consequently, the peripheral portion of the front surface of the wafer W is cleaned, thereby removing defects on the peripheral portion of the coating films, which may bring about film peeling in immersion light exposure.

After the cleaning on the peripheral portion of the front surface of the wafer W is finished, the supply of purified water from the purified water supply mechanism 44 is stopped, but the wafer W is kept rotated by the spin chuck 41, to perform throwing-off and drying on the wafer W (STEP 6). Then, the spin chuck 41 stops being rotated and is moved up, and the transfer port 40a is opened by the shutter 40b. Then, the wafer W is unloaded through the transfer port 40a from the chamber 40 (STEP 7).

According to this embodiment, as described above, edge-cutting is performed by use of purified water as a solvent-ability decreasing agent, thereby providing the effect of preventing process defects, such as sags, disorders, and/or humps on the edge portion. Further, cleaning is performed after the edge-cutting, thereby providing the effect of removing defects that may bring about film peeling. Consequently, film peeling is effectively prevented in immersion light exposure. Further, the solvent ability is suppressed by purified water and thus no soft baking process is required before cleaning, whereby the apparatus structure and process steps are prevented from being complicated.

Purified water is used as a solvent-ability decreasing agent, so the purified water nozzle 43b used for the edge portion cutting can be also used for the cleaning; which is efficient. The top coating unit (ITC), which belongs to a group of coating units, is used to perform the edge-cutting and edge cleaning subsequently to the coating performed therein. This arrangement can provide a high throughput and make the apparatus compact because of no additional unit required.

Cleaning may be performed by use of purified water on the edge portion of the wafer W prior to the edge portion cutting step. In this case, the edge portion has higher cleanness when the cutting is performed.

Figure 9:
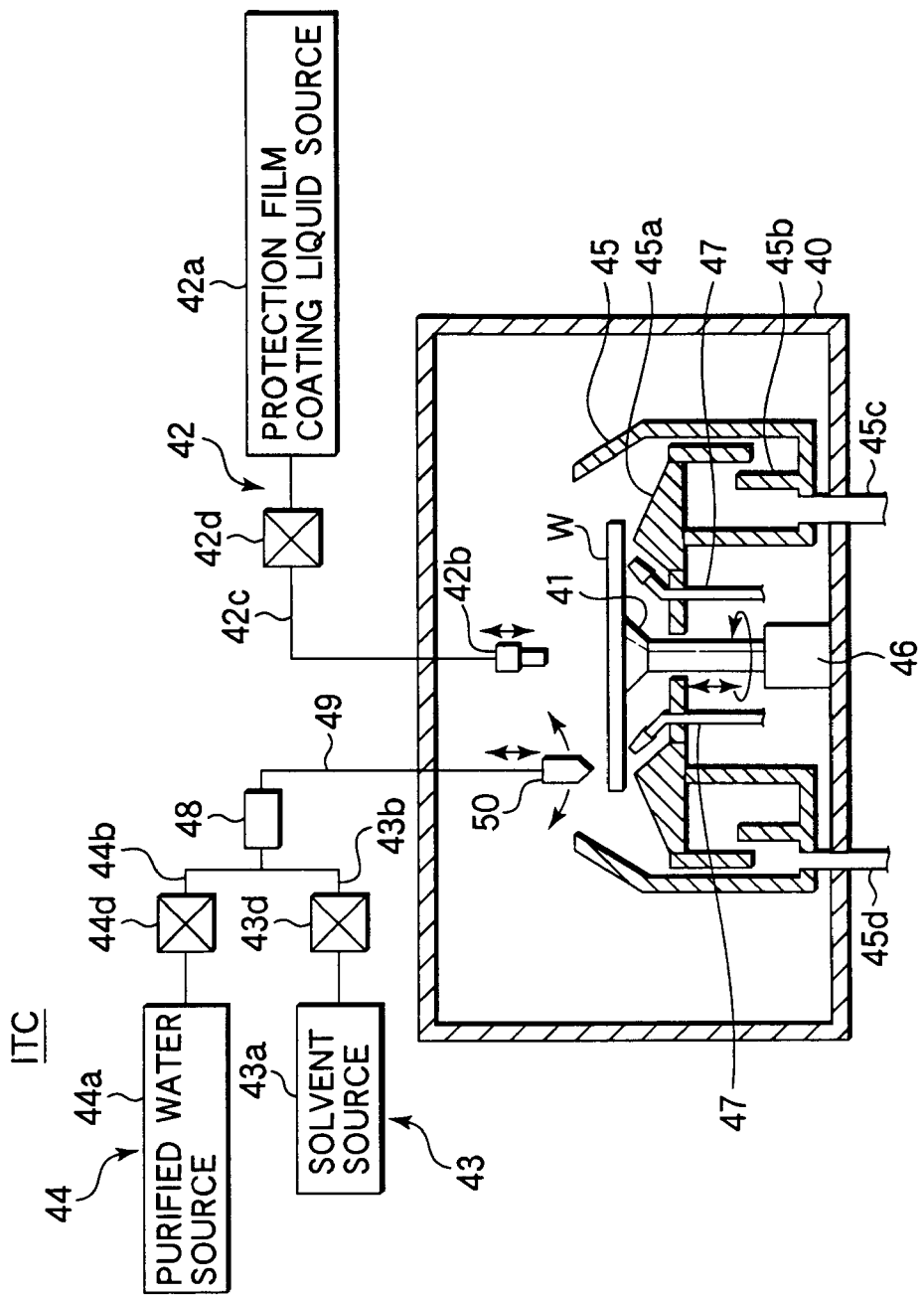
FIG. 9 is a view showing a top coating unit, which includes a modification of a solvent supply mechanism and a purified water supply mechanism, disposed in the pattern forming system shown in FIG. 1.

Next, an explanation will be given of a modification of the solvent supply mechanism and purified water supply mechanism of the top coating unit (ITC). FIG. 9 is a view showing a top coating unit (ITC), which includes a modification of the solvent supply mechanism and purified water supply mechanism.

In the modification shown in FIG. 9, the solvent supply mechanism 43 and purified water supply mechanism 44 share a common nozzle. Specifically, a conduit line 43b and a conduit line 44b are connected to a mixing valve 48 for mixing the solvent and purified water. The mixing valve 48 is connected through a conduit line 49 to a nozzle 50 for supplying the mixture liquid. In this case, valves 43d and 44d are operated to adjust the mixing ratio of the solvent and purified water before the mixture liquid is delivered. This makes it possible to reliably prevent process defects, such as sags, disorders, and/or humps, on the edge portion. When cleaning is performed, the valve 43d is closed to stop supply of the solvent and to solely supply purified water. This arrangement can also provide the effect of making the apparatus compact.

In the embodiment described above, when edge portion cutting is performed on a coating film formed on the surface of a substrate, a solvent-containing liquid, such as a combination of a solvent and a solvent-ability decreasing agent for decreasing the solvent ability, or a diluted solvent, is supplied, such that the solvent ability on the edge portion is decreased. In this case, even where no soft baking process is performed, the edge portion is prevented from suffering process defects, such as sags, disorders, and/or humps. Further, after the edge portion cutting step, cleaning is performed by use of a cleaning liquid, without passing through a soft baking process, thereby removing defects, which may bring about film peeling in immersion light exposure. Consequently, it is possible to effectively prevent a coating film from peeling off a substrate in immersion light exposure, without complicating the apparatus structure and process steps. Particularly, where purified water is used as a solvent-ability decreasing agent and a cleaning liquid, cleaning can be performed by use of purified water as a cleaning liquid immediately after the edge portion cutting step performed by use of purified water as a solvent-ability decreasing agent. This arrangement can enhance the effects described above.

The present invention is not limited to the embodiment described above, and it may be modified in various manners. For example, in the embodiment described above, the top coating unit (ITC) is used for the edge portion cutting and cleaning as well as protection film formation. However, where no protection film is required, the resist coating unit (COT) may be used to perform the edge portion cutting and cleaning after resist film coating. The resist coating unit (COT) and top coating unit (ITC) belong to the same group of coating units and have the same structure except that their coating liquids supplied onto the surface of a wafer W are a resist liquid and a protection film coating liquid, respectively. Accordingly, where the resist coating unit (COT) is provided with a solvent supply mechanism and a purified water supply mechanism, as described above, the unit can perform the edge portion cutting and cleaning for a coating film in the same manner, thereby providing the same effects.

In the embodiment described above, the top coating unit (ITC), which belongs to a group of coating units, is used to perform the edge portion cutting and cleaning subsequently to a coating process performed therein. Alternatively, it may be arranged such that only a simple edge process is performed in the coating unit, and the edge portion cutting and cleaning is performed in another unit. In the embodiment described above, purified water is used as a solvent-ability decreasing agent, but any material other than purified water can be used for the same purpose as long as it has the effect of decreasing the solvent ability.

In the edge portion cutting, a diluted solvent, such as a diluted thinner, may be used in place of a solvent and purified water. Further, in the edge portion cutting, a diluted solvent process may be sequentially performed after a solvent and purified water are supplied to perform edge-cutting.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A coating film processing apparatus for processing a coating film on a surface of a substrate to be subjected to an immersion light exposure process that performs light exposure through a liquid, the apparatus comprising:
   a spin chuck configured to hold and rotate the substrate in a horizontal state inside the process container;
   a rotary mechanism configured to rotate the spin chuck;
   a solvent-containing liquid supply mechanism configured to supply a solvent-containing liquid comprising a combination of a solvent and a solvent-ability decreasing agent for decreasing solvent-ability onto an edge portion of the coating film on the surface of the substrate held by the spin chuck;
   a cleaning liquid supply mechanism configured to supply a cleaning liquid onto the edge portion of the coating film on the surface of the substrate held by the spin chuck, and
   a control section configured to control an operation of the apparatus and including a non-transitory computer readable storage medium storing a control program, wherein the control program, when executed, causes the control section to control the apparatus to conduct a coating film processing sequence that includes supplying the solvent-containing liquid from the solvent-containing liquid supply mechanism onto the edge portion of the coating film, while holding and rotating the substrate by the spin chuck, thereby performing edge portion cutting; and then supplying the cleaning liquid from the cleaning liquid supply mechanism onto the edge portion of the coating film, thereby performing edge portion cleaning, such that the solvent-ability decreasing agent supplied from the solvent-containing liquid supply mechanism and the cleaning liquid supplied from the cleaning liquid supply mechanism consist of the same liquid supplied from the same supply source.

2. The coating film processing apparatus according to claim 1, wherein said same liquid is purified water.

3. The coating film processing apparatus according to claim 1, wherein the cleaning liquid supply mechanism includes a cleaning liquid nozzle configured to supply the cleaning liquid.

4. The coating film processing apparatus according to claim 1, wherein the solvent-containing liquid supply mechanism includes a mixture supply nozzle configured to supply a mixture of the solvent and the solvent-ability decreasing agent.

5. The coating film processing apparatus according to claim 1, wherein the solvent-containing liquid supply mechanism includes a solvent nozzle configured to supply the solvent and a solvent-ability decreasing agent nozzle configured to supply the solvent-ability decreasing agent.

6. The coating film processing apparatus according to claim 5, wherein the solvent-ability decreasing agent nozzle serves as a cleaning liquid nozzle for supplying the cleaning liquid of the cleaning liquid supply mechanism.

7. The coating film processing apparatus according to claim 5, wherein the apparatus further comprises a positioning mechanism configured to support and variably position the solvent nozzle and the solvent-ability decreasing agent nozzle.

8. The coating film processing apparatus according to claim 7, wherein the positioning mechanism includes first and second nozzle arms respectively supporting the solvent nozzle and the solvent-ability decreasing agent nozzle such that each of the first and second nozzle arms is movable up and down and movable in at least one lateral direction.

9. The coating film processing apparatus according to claim 7, wherein the positioning mechanism is arranged such that each of the solvent nozzle and the solvent-ability decreasing agent nozzle is adjustable in angle relative to the surface of the substrate.

10. The coating film processing apparatus according to claim 1, further comprising a coating liquid supply mechanism configured to supply the coating liquid, and the coating film processing sequence further includes supplying the coating liquid from coating liquid supply mechanism onto the substrate, while rotating the substrate, thereby forming the coating film before said supplying the solvent-containing liquid.

11. The coating film processing apparatus according to claim 1, wherein the coating film includes a protection film coating a resist film to be subjected to the immersion light exposure process.

* * * * *